(12) United States Patent
Hanson et al.

(10) Patent No.: US 7,247,889 B2
(45) Date of Patent: Jul. 24, 2007

(54) III-NITRIDE MATERIAL STRUCTURES INCLUDING SILICON SUBSTRATES

(75) Inventors: Allen W. Hanson, Cary, NC (US); John Claassen Roberts, Hillsborough, NC (US); Edwin L. Piner, Cary, NC (US); Pradeep Rajagopal, Raleigh, NC (US)

(73) Assignee: Nitronex Corporation, Durham, NC (US)

( * ) Notice: Subject to any disclaimer, the term of this patent is extended or adjusted under 35 U.S.C. 154(b) by 270 days.

(21) Appl. No.: 11/004,628

(22) Filed: Dec. 3, 2004

(65) Prior Publication Data

US 2006/0118819 A1    Jun. 8, 2006

(51) Int. Cl.
*H01L 31/00* (2006.01)
*H01L 21/28* (2006.01)

(52) U.S. Cl. ............... 257/189; 257/615; 257/E33.037; 257/E33.049; 438/604

(58) Field of Classification Search ............... None
See application file for complete search history.

(56) References Cited

U.S. PATENT DOCUMENTS

| | | | |
|---|---|---|---|
| 3,544,864 A * | 12/1970 | Richman | 257/288 |
| 3,717,790 A * | 2/1973 | Dalton et al. | 438/73 |
| 4,843,440 A | 6/1989 | Huang | |
| 5,192,987 A | 3/1993 | Khan et al. | |
| 5,239,188 A | 8/1993 | Takeuchi et al. | |
| 5,290,393 A | 3/1994 | Nakamura | |
| 5,296,395 A | 3/1994 | Khan et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,633,192 A | 5/1997 | Moustakas et al. | |
| 5,679,965 A | 10/1997 | Schetzina | |
| 5,739,554 A | 4/1998 | Edmond et al. | |
| 5,741,724 A | 4/1998 | Ramandi et al. | |
| 5,760,426 A | 6/1998 | Marx et al. | |
| 5,786,606 A | 7/1998 | Nishio et al. | |
| 5,815,520 A | 9/1998 | Furushima | |
| 5,838,029 A | 11/1998 | Shakuda | |
| 5,838,706 A | 11/1998 | Edmond et al. | |
| 5,874,747 A | 2/1999 | Redwing et al. | |
| 5,929,467 A | 7/1999 | Kawai et al. | |

(Continued)

FOREIGN PATENT DOCUMENTS

WO    WO 96/41906    12/1996

(Continued)

OTHER PUBLICATIONS

Cordier, Y., et al., "MBE growth of high quality AlGaN/GaN HEMTs on resistive Si(111) substrate with RF small signal and power performances", IEEE (2002) 99-100.

(Continued)

*Primary Examiner*—Alonzo Chambliss
(74) *Attorney, Agent, or Firm*—Wolf, Greenfield & Sacks, P.C.

(57) ABSTRACT

III-nitride material structures including silicon substrates, as well as methods associated with the same, are described. Parasitic losses in the structures may be significantly reduced which is reflected in performance improvements. Devices (such as RF devices) formed of structures of the invention may have higher output power, power gain and efficiency, amongst other advantages.

32 Claims, 9 Drawing Sheets

U.S. PATENT DOCUMENTS

| | | | |
|---|---|---|---|
| 6,051,849 | A | 4/2000 | Davis et al. |
| 6,064,078 | A | 5/2000 | Northrup et al. |
| 6,064,082 | A | 5/2000 | Kawai et al. |
| 6,069,021 | A | 5/2000 | Terashima et al. |
| 6,100,545 | A | 8/2000 | Chiyo et al. |
| 6,120,600 | A | 9/2000 | Edmond et al. |
| 6,121,121 | A | 9/2000 | Koide |
| 6,139,628 | A | 10/2000 | Yuri et al. |
| 6,146,457 | A | 11/2000 | Solomon |
| 6,153,010 | A | 11/2000 | Kiyoku et al. |
| 6,156,581 | A | 12/2000 | Vaudo et al. |
| 6,177,688 | B1 | 1/2001 | Linthicum et al. |
| 6,180,270 | B1 | 1/2001 | Cole et al. |
| 6,201,262 | B1 | 3/2001 | Edmond et al. |
| 6,255,198 | B1 | 7/2001 | Linthicum et al. |
| 6,261,929 | B1 | 7/2001 | Gehrke et al. |
| 6,261,931 | B1 | 7/2001 | Keller et al. |
| 6,265,289 | B1 | 7/2001 | Zheleva et al. |
| 6,291,319 | B1 | 9/2001 | Yu et al. |
| 6,329,063 | B2 | 12/2001 | Lo et al. |
| 6,380,108 | B1 | 4/2002 | Linthicum et al. |
| 6,391,748 | B1 | 5/2002 | Temkin et al. |
| 6,403,451 | B1 | 6/2002 | Linthicum et al. |
| 6,420,197 | B1 | 7/2002 | Ishida et al. |
| 6,426,512 | B1 | 7/2002 | Ito et al. |
| 6,440,823 | B1 | 8/2002 | Vaudo et al. |
| 6,441,393 | B2 | 8/2002 | Goetz et al. |
| 6,459,712 | B2 | 10/2002 | Tanaka et al. |
| 6,465,814 | B2 | 10/2002 | Kasahara et al. |
| 6,486,502 | B1 | 11/2002 | Sheppard et al. |
| 6,498,111 | B1 | 12/2002 | Kapolnek et al. |
| 6,521,514 | B1 | 2/2003 | Gehrke et al. |
| 6,524,932 | B1 | 2/2003 | Zhang et al. |
| 6,548,333 | B2 | 4/2003 | Smith |
| 6,583,034 | B2 | 6/2003 | Ramdani et al. |
| 6,583,454 | B2 | 6/2003 | Sheppard et al. |
| 6,586,781 | B2 | 7/2003 | Wu et al. |
| 6,610,144 | B2 | 8/2003 | Mishra et al. |
| 6,611,002 | B2 | 8/2003 | Weeks et al. |
| 6,617,060 | B2 | 9/2003 | Weeks et al. |
| 6,624,452 | B2 | 9/2003 | Yu et al. |
| 6,649,287 | B2 | 11/2003 | Weeks, Jr. et al. |
| 6,765,240 | B2 | 7/2004 | Tischler et al. |
| 6,765,241 | B2 | 7/2004 | Ohno et al. |
| 6,777,278 | B2 | 8/2004 | Smith |
| 6,841,409 | B2 | 1/2005 | Onishi |
| 6,849,882 | B2 | 2/2005 | Chavarkar et al. |
| 7,141,489 | B2 * | 11/2006 | Burgener et al. ........... 438/478 |
| 2001/0042503 | A1 | 11/2001 | Lo et al. |
| 2002/0020341 | A1 | 2/2002 | Marchand et al. |
| 2002/0117695 | A1 | 8/2002 | Borges |
| 2003/0136333 | A1 | 7/2003 | Semond et al. |
| 2004/0119063 | A1 | 6/2004 | Guo et al. |
| 2004/0119067 | A1 | 6/2004 | Weeks et al. |
| 2005/0133818 | A1 | 6/2005 | Johnson et al. |

FOREIGN PATENT DOCUMENTS

| | | | |
|---|---|---|---|
| WO | WO 01/13436 A1 | 2/2001 | |

OTHER PUBLICATIONS

Hageman, P.R., et al., "Growth of GaN epilayers on Si(111) substrates using multiple buffer layers", Mat. Res. Soc. Symp. Proc. vol. 693 (2002) 105-110.

Hoël, V., et al., "High-power AlGaN/GaN HEMTS on resistive silicon substrate", Electronics Letters, vol. 38, No. 14 (2002) 750-752.

International Search Report and Written Opinion, from PCT/US2005/043810, mailed Aug. 28, 2006.

SZE, S.M., "Physics of semiconductor devices", Wiley & Sons (1981) p. 32, fig. 21.

Amano, H. et al., "Improvement of Crystalline Quality if Group III Nitrides on Sapphire Using Low Temperature Interlayers," J. Nitride Semicond. Res. 4S1, G10.1 (1999).

Ando, Y. et al., "10-W/mm AlGaN-GaN HFET With a Field Modulating Plate," IEEE Electron Device Lett. 24(5):289 (2003).

Ando, Y. et al., "A 110-W AlGaN/GaN Heterojunction FET On Thinned Sapphire Substrate," Photonic and Wireless Devices Research Labs, NEC Corp. (2001).

Binari, S.C. et al., "Microwave Performance of GaN MESFETs," Electronics Lett. 30(15):1248 (1994).

Bindra, A., "Exotic Materials Squeeze More Juice Out of RF Power Amplifiers," www.elecdesign.com, ED Online ID #2367, Jun. 24, 2002.

Borges, R. et al., "GaN HFETs on Silicon Target Wireless Infrastructure Market," Compound Semiconductor, p. 2 (Aug. 2003).

Brown, J.D. et al., "AlGaN/GaN HFETs Fabricated on 100-mm GaN on Silicon (111) Substrates," Solid-State Electronics 46:1535 (2002).

Brown, J.D. et al., "Performance of AlGaN/GaN HFETs Fabricated on 100mm Silicon Substrates for Wireless Basestation-Applications," Nitronex Corporation, IEEE MTT-S Digest p. 833 (2004).

Chen, P. et al., "Growth of High Quality GaN Layers With AlN Buffer on Si(111) Substrates," J. Crystal Growth 225:150 (2001).

Chumbes, E. et al., "AlGaN/GaN High Electron Mobility Transistors on Si(111) Substrates," IEEE Trans. Electron Dev. 48(3):420 (2001).

Dadgar, A. et al., "Bright, Crack-Free InGaN/GaN Light Emitters on Si(111)," Phys. Stat. Sol. 192(2):308 (2002).

Dadgar, A. et al., "Metalorganic Chemical Vapor Phase Epitaxy of Crack-Free GaN on Si(111) Exceeding 1 μm in Thickness," Jpn. J. Appl. Phys. 39:L1183 (2000).

Dadgar, A. et al., "MOVPE Growth of GaN on Si(111) Substrates," J. Crystal Growth 248:556 (2003).

Elhamri, S. et al., "An Electrical Characterization of a Two Dimensional Electron Gas in GaN/AlGaN on Silicon Substrates," J. Appl. Phys. 95(12):7982 (2004).

Fanning, D. et al., "Dielectrically Defined Optical T-Gate for High Power GaAs pHEMTs," GaAsMANTECH Conference (2002).

Feltin, E. et al., "Stress Control in GaN Grown on Silicon (111) by Metalorganic Vapor Phase Epitaxy," Phys. Lett. 79:3230 (2001).

Guha, S. et al., "Ultraviolet and Violet GaN Light Emitting Diodes on Silicon," Appl. Phys. Lett. 72(4):415 (1998).

Hageman, P.R. et al., "High Quality GaN Layers on Si(111) Substrates: AlN Buffer Layer Optimisation and Insertion of a SiN Intermediate Layer," Phys. Stat. Sol. 188(2):523 (2001).

Hanington, G. et al., "P/He Ion Implant Isolation Technology for AlGaN/GaN HFETs," Electronics Lett. 34(2):193 (1998).

Hanson, A.W. et al., "Development of a GaN Transistor Process for Linear Power Applications," Nitronex Corporation, Paper presented at the 2004 International Conference on Compound Semiconductor Manufacturing Technology (GaAs MANTECH), Miami, FL.

Heikman, S. et al., "Growth of Fe Doped Semi-Insulating GaN by Metalorganic Chemical Vapor Deposition," Appl. Phys. Lett. 81:439 (2002).

Hirosawa, K. et al., "Growth of Single Crystal $Al_2Ga_{1-\alpha}N$ Films on Si Substrates by Metalorganic Vapor Phase Epitaxy," Jpn. J. Appl. Phys. 32:L1039 (1993).

Huo, X. et al., "High-Q Copper Inductors on Standard Silicon Substrate With Low-K BCB Dielectric Layer," IEEE Radio Frequency Integrated Circuit Symposium, pp. 403-406 (2002).

Ishikawa, H. et al. "High-Quality GaN on Si Substrate Using AlGaN/AlN Intermediate Layer," Phys. Stat. Sol. 176:599 (1999).

Johnson, J.W. et al., "12 W/mm AlGaN-GaN HFETs on Silicon Substrates," IEEE Electron Device Lett. 25(7):459 (2004).

Johnson, J.W. et al., "$Gd_2O_3$/GaN Metal-Oxide-Semiconductor Field-Effect Transistor," Appl. Phys. Lett. 77(20):3230 (2000).

Johnson, J.W. et al., "Material, Process, and Device Development of GaN-Based HFETs on Silicon Substrates," Nitronex Corporation, Electrochemical Society Proceedings Jun. 2004, 405 (2004).

Joshin, K. et al., "A 174 W High-Efficiency GaN HEMT Power Amplifier for W-CDMA Base Station Applications," Fujitsu Laboratories Ltd. (2003).

Kang, B.S. et al., "Pressure-Induced Changes in the Conductivity of AlGaN/GaN High-Electron Mobility-Transistor Membranes," Appl. Phys. Lett. 85(14):2962 (2004).

Kikkawa, T. et al., "An Over 200-W Output Power GaN HEMT Push-Pull Amplifier with High Reliability," IEEE MTT-S Digest (2004).

Ladbrooke, P., "MMIC Design: GaAs FETs and HEMTs," Artech House, pp. 29-52 (Boston 1989).

Lahreche, H. et al., "Optimisation of AlN and GaN Growth by Metalorganic Vapour-Phase Epitaxy (MOVPE) on Si(111)," J. Crystal Growth 217:13 (2000).

Lee, I. et al., "Growth and Optical Properties of GaN on Si(111) Substrates," J. Crystal Growth 235:73 (2002).

Lei, T. et al., "Epitaxial Growth of Zinc Blende and Wurtzitic Gallium Nitride Thin Films on (001) Silicon," Appl. Phys. Lett. 59(8):944 (1991).

Liaw, H.M. et al., "GaN Epilayers Grown on 100mm Diameter Si(111) Substrates," Solid-State Electronics 44:685 (2000).

Liu, R. et al. "Atomic Arrangement at the AlN/Si (111) Interface," Appl. Phys. Lett. 83(5):860 (2003).

Moser, N.A. et al., "Effects or Surface Treatments on Isolation Currents in AlGaN/GaN High-Electron-Mobility Transistors," Appl. Phys. Lett. 83(20):4178 (2003).

Nagy, W. et al., "Linearity Characteristics of Microwave Power GaN HEMTs," IEEE Transactions on Microwave Theory & Techniques 51(2):1 (2003).

Nakada, Y. et al. "GaN Heteroepitaxial Growth on Silicon Nitride Buffer Layers Formed on Si(111) Surfaces by Plasma-Assisted Molecular Beam Epitaxy," Appl. Phys. Lett. 73(6):827 (1998).

Newey, J., "GaN: Ready for Cellular 3G?," Compound Semiconductor, p. 21 (Jan./Feb. 2004).

Nikishin, S.A. et al., "High Quality GaN Grown on Si(111) by Gas Source Molecular Beam Epitaxy with Ammonia," Appl. Phys. Lett. 75(14):2073 (1999).

Nuttinck, S. et al., "Direct On-Wafer Non-Invasive Thermal Monitoring of AlGaN/GaN Power HFETs Under Microwave Large Signal Conditions," Paper Presented at European Microwave Week, Amsterdam, NL (2004).

Ohtani, A. et al. "Microstructure and Photoluminescence of GaN Grown on Si(111) by Plasma-Assisted Molecular Beam Epitaxy," Appl. Phys. Lett. 65(1):61 (1994).

Okamoto, Y. et al., "An 80W AlGaN/GaN Heterojunction FET With a Field-Modulating Plate," IEEE MTT-S Digest p. 225 (2003).

Osinsky, A. et al., "Visible-Blind GaN Schottky Barrier Detectors Grown on Si(111)," Appl. Phys. Lett. 72(5):551 (1998).

Palmour, J.W. et al., "Wide Bandgap Semiconductor Devices and MMICs for RF Power Applications," IEEE (2001).

Patel, S., "The Bottleneck on the Road to 3G," WirelessFuture Magazine (Jan./Feb. 2003).

Piner, E., "GaN Transistors and Power Amplifiers Close in on Commercialization," Compound Semiconductor (Jul. 2004).

Pucel, R.A., "Design Considerations for Monolithic Microwave Circuits," IEEE Transactions on MTT 29:513 (Jun. 1981).

Rajagopal, P. et al., "Large-Area, Device Quality GaN on Si Using a Novel Transition Layer Scheme," Nitronex Corporation, Material Research Society Symposium Proceedings 743(3) (2003).

Rajagopal, P. et al., "MOCVD AlGaN/GaN HFETs on Si: Challenges and Issues," Symposium Y: GAN and Related Alloys, Nitronex Corporation, Material Research Society Symposium Proceedings, 798, 61-66 (2004).

Reitmeier, Z. et al. "Growth and Characterization of AlN and GaN Thin Films Deposited on Si(111) Substrates Containing a Very Thin Al Layer," Dept. Materials Science & Engineering, NC State University.

Reyes, A. et al. "High Resistivity Si as a Microwave Substrate," Electronic Components and Technology Conference 382-391 (1996).

Semond, F. et al., "GaN Grown on Si(111) Substrate: From Two-Dimensional Growth to Quantum Well Assessment," Appl. Phys. Lett. 75(1):82 (1999).

Seon, M. et al., "Selective Growth of High Quality GaN on Si(111) Substrates," Appl. Phys. Lett. 76(14):1842 (2000).

Singhal, S. et al., "Gallium Nitride on Silicon HEMTs for Wireless Infrastructure Applications, Thermal Design and Performance," Nitronex Corporation, Paper presented at the European Microwave Week, Milan, Italy (2002).

Tanaka, S. et al., "Defect Structure in Selective Area Growth GaN Pyramid on (111)Si Substrate," Appl. Phys. Lett. 76(19):2701 (2000).

Thompson, R. et al., "Improved Fabrication Process for Obtaining High Power Density AlGaN/GaN HEMTs," IEEE GaAs Digest p. 298 (2003).

Vescan, A. et5 al., "AlGaN/GaN HFETs on 100 mm Silicon Substrates for Commercial Wireless Applications," Phys. Stat. Sol. (c) 0(1):52 (2002).

Wu, J. et al., "Crystal Structure of GaN Grown on 3C-SiC Substrates by Metalorganic Vapor Phase Epitaxy," Jpn. J. Appl. Phys. 36:4241 (1997).

Yoon, J. et al., "Monolithic High-Q Overhang Inductors Fabricated on Silicon and Glass Substrates," 1999 International Electron evice Meeting, Technical Digest, pp. 753-756.

Yue, C.P. et al., "On-Chip Spiral Inductors with Patterned Ground-Shields for Silicon-Based RF ICs," IEEE J. Solid State Circuits 33(5):743 (May 1998).

Zhao, Z.M. et al., "Metal-Semiconductor-Metal GaN Ultraviolet Photodetectors on Si(111)," Appl. Phys. Lett. 77(3):444 (2000).

* cited by examiner

III-NITRIDE MATERIAL STRUCTURES INCLUDING SILICON SUBSTRATES

FIELD OF INVENTION

The invention relates generally to III-nitride materials and, more particularly, to gallium nitride material structures including silicon substrates.

BACKGROUND OF INVENTION

III-nitride materials include gallium nitride (GaN), aluminum nitride (AlN), indium nitride (InN) and their respective alloys (e.g., AlGaN, InGaN, AlInGaN and AlInN). In particular, gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit blue light, the ability to transmit signals at high frequency, and others.

In many applications, III-nitride materials are grown on a substrate. However, property differences between III-nitride materials (e.g., gallium nitride materials) and many substrate materials can present challenges. For example, gallium nitride materials (e.g., GaN) have a different thermal expansion coefficient (i.e., thermal expansion rate) and lattice constant than many substrate materials and, in particular, silicon. These differences may lead to formation of cracks and/or other types of defects in gallium nitride material layers that are grown on silicon. In some methods, a transition layer is used to mitigate the effects of these differences in order to grow high quality gallium nitride material on silicon. However, these differences (and others) have limited commercialization of structures and devices that include gallium nitride material formed on silicon substrates.

III-nitride materials (e.g., gallium nitride materials) are being investigated in high frequency (e.g., RF) device applications. When energy is dissipated in high frequency devices through undesirable mechanisms, the performance of the device may be impaired. These so-called parasitic losses can reduce output power, power gain and efficiency. Therefore, it is generally desirable to limit the parasitic losses in high frequency (and other types of) devices.

SUMMARY OF INVENTION

The invention relates, in part, to III-nitride material (e.g., gallium nitride material) structures including silicon substrates and methods associated with the same.

In one aspect, a semiconductor structure is provided. The structure comprises a silicon substrate having a resistivity of greater than $10^2$ Ohms-cm. The silicon substrate includes a top surface region having a peak free carrier concentration of less than $10^{17}/cm^3$. A III-nitride material region is formed over the top surface of the silicon substrate.

In another aspect, a semiconductor structure is provided. The structure comprises a silicon substrate; and a III-nitride material region formed on the silicon substrate. The structure has a transmission line loss of less than 1.0 dB/mm over a frequency range between 0 and 5 GHz.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The invention provides III-nitride material structures including silicon substrates, as well as methods associated with the same. It has been discovered that parasitic conducting channels can arise when growing III-nitride materials (e.g., gallium nitride materials) on silicon substrates, particularly on highly resistive silicon substrates (e.g., resistivity of greater than $10^2$ Ohm-cm). The parasitic channel is typically formed at a top surface of the silicon substrate and can provide a mechanism for undesired energy absorption within the structure. As described further below, methods of the invention include limiting the formation and/or effect of such parasitic channels. The parasitic losses in the resulting structures may be significantly reduced which is reflected in performance improvements. For example, devices (such as RF devices) formed of structures of the invention may have higher output power, power gain and efficiency, (even at higher operating frequencies) amongst other advantages.

Figure 1:
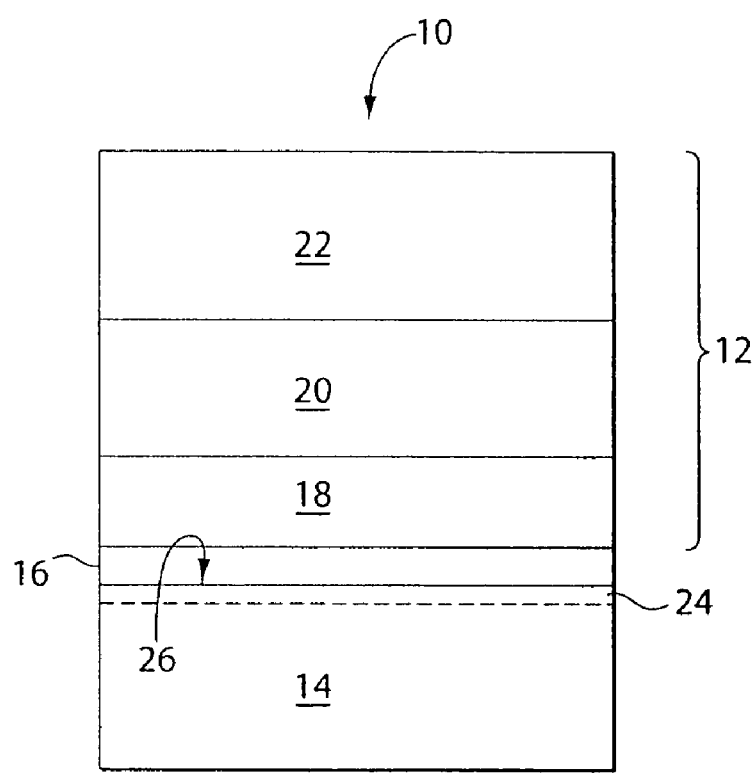
FIG. 1 illustrates a structure including a III-nitride material region formed on a silicon substrate according to one embodiment of the invention.

FIG. 1 shows a semiconductor structure 10 according to one embodiment of the invention. Structure 10 includes a III-nitride material region 12 formed on a silicon substrate 14. As shown, one or more layers (e.g., layer 16) may be formed between the substrate and the III-nitride material region. The III-nitride material region may comprise a number of layers including an intermediate layer 18, a transition layer 20 and a gallium nitride material layer 22, amongst others. In the illustrative embodiment, a parasitic conducting channel 24 is formed at (or proximate to) a top surface 26 of the substrate. As described further below, the carrier concentration in the parasitic conducting channel is reduced by methods of the invention. Thus, parasitic losses associated with undesired conduction through this channel are minimized.

When a structure (e.g., layer and/or device) is referred to as being "on" or "over" another structure (e.g., layer or substrate), it can be directly on the structure, or an intervening structure (e.g., a layer, air gap) also may be present. A structure that is "directly on" another structure means that no intervening structure is present. It should also be understood that when a structure is referred to as being "on" or "over" another structure, it may cover the entire structure, or a portion of the structure.

It is believed that the parasitic channel is formed by the diffusion of dopants that are unintentionally introduced into the silicon substrate prior to, or during, the growth of layers/regions (e.g., III-nitride material region) on the substrate. As described further below, the dopants may include the elements (e.g., Group III element(s) and/or nitrogen) from the reactive species which participate in the reaction that forms the III-nitride material region. For example, the dopants may be gallium and/or aluminum; though, it should be understood that other dopants may also contribute to forming the parasitic channel. Once diffused into the substrate, the dopants generate free carriers (i.e., electrons or holes) which, in effect, form a conductive channel at the substrate surface. As described further below, the conductive channel is particularly significant in leading to parasitic losses in structures formed on highly resistive silicon substrates.

Advantageously, structures of the invention include parasitic channels 24 having a reduced free carrier concentration which results in lowering parasitic losses as noted above. For example, the peak free carrier concentration (or, carrier concentration) may be less than about $10^{17}/cm^3$. In some embodiments, the peak free carrier concentration is less than about $5 \times 10^{16}/cm^3$; or, less than about $10^{16}/cm^3$. In some embodiments, the peak free carrier concentration may even be less than about $10^{15}/cm^3$. The specific peak free carrier concentration may depend on a number of factors including the particular methods used to reduce carrier concentration described below. Free carrier concentration may be measured using standard techniques known to those of ordinary skill in the art including spreading resistance profiling (SRP) and Secondary Ion Mass Spectroscopy (SIMS).

The parasitic channel is formed in a top surface region and extends for a depth (d) into the substrate surface. In most cases, the parasitic channel extends to the top surface, but it is possible for the top surface region to include a thin portion at the top surface that is not parasitic and for the parasitic channel to be beneath that portion and, thus, proximate to the top surface. In general, depth (d) is the distance from the top surface at which the free carrier concentration of the parasitic channel is equal to the free carrier concentration of the bulk substrate. Thus, depth (d) depends, in part, on the free carrier concentration of the bulk substrate. In some embodiments, such as when the silicon substrate is highly resistive, the free carrier concentration may be less than about $10^{14}/cm^3$ (e.g., $10^{12}/cm^3$). Typical parasitic channel depths may be at least 1 micron and may be less than about 5 microns.

It should be understood that portions of the parasitic channel having relatively low carrier concentrations (e.g., less than about $10^{14}/cm^3$) may not have a significant, if any, impact on device performance.

The free carrier concentration in the parasitic channel typically decreases with distance from the substrate top surface. For example, FIGS. 4A-5B are profiles of carrier concentration versus depth from the top surface, as described further in Example 1. One feature of the invention is that the free carrier concentration is reduced at a given depth. For example, at a depth of 1.0 micron from the substrate surface, the carrier concentration may be less than about $10^{16}/cm^3$; in some cases, less than about $5 \times 10^{15}/cm^3$; and, in some cases, less than about $10^{15}/cm^3$. Depth profiles may be generated using the SRP and SIMS techniques noted above.

As described above, substrate 14 is a silicon substrate. As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and SIMOX substrates, amongst others. Suitable silicon substrates also include substrates that have a silicon wafer bonded to another material such as diamond, AlN, or other polycrystalline materials. Silicon substrates having different crystallographic orientations may be used, though single crystal silicon substrates are preferred. In some cases, silicon (111) substrates are preferred. In other cases, silicon (100) substrates are preferred.

In certain preferred embodiments, the silicon substrate (or at least the silicon portion of the substrate for substrates that include a silicon portion formed on another material) is highly resistive. For example, the resistivity of the silicon substrate (or the silicon portion of the substrate) may be greater than or equal to about $10^2$ Ohms-cm. In some cases, the resistivity of the substrate (or the silicon portion of the substrate) may be greater than or equal to about $10^4$ Ohms-cm; or even, greater than or equal to about $10^5$ Ohms-cm.

Highly resistive silicon substrates may be particularly preferred in structures that are used to form devices that operate at high frequencies (e.g., RF devices). The high resistivity can reduce so-called substrate losses which otherwise may arise and sacrifice performance. These substrate losses may render silicon substrates with lower resistivities unsuitable in high frequency devices.

It has been observed that the parasitic channel generally has a significantly greater effect in structures that include highly resistive silicon substrates as compared to structures that include substrates having more conventional resistivities (e.g., 0.01-0.1 Ohms-cm). Because silicon substrates having more conventional resistivities typically have bulk carrier concentrations on the order of $10^{18}/cm^3$, the dopant diffusion phenomena described above may not substantially, or even at all, change the carrier concentration at the substrate surface. Thus, a parasitic channel may not be generated in such substrates. In contrast, the dopant diffusion phenomena can have a significant effect on the carrier concentration at the surface region in substrates having high resistivities which typically have bulk carrier concentrations on the order of $10^{14}/cm^3$ or lower. For these reasons, it is generally more critical to reduce the effects of the parasitic channel in structures that include highly resistive silicon substrates.

In the illustrative embodiment, layer 16 is formed directly on the substrate. As described further below, layer 16 may be formed prior to introduction in to the reaction chamber of reactive species (e.g., Al, Ga species) that react to form the III-nitride material region. Thus, the layer forms a barrier that limits, or prevents, dopant accumulation on the silicon substrate surface, amongst other functions. Because the dopant concentration accumulated on the silicon substrate surface is reduced, dopant diffusion into the silicon is also decreased which results in the parasitic conducting channel having a lower conductivity. It should be understood, however, that in some cases, some dopant diffusion may occur through layer 16 and into the substrate.

Structures of the invention may include a layer formed between the substrate and the III-nitride material region. Thus, in these cases, the III-nitride material region may be formed directly on the substrate. In some cases, structures may include more than one layer between the substrate and the III-nitride material region.

In certain preferred embodiments, layer 16 is formed of a nitride-based material such as a silicon nitride-based material. Silicon nitride-based materials include any silicon nitride-based compound (e.g., $Si_xN_y$, such as SiN and $Si_3N_4$, SiCN, amongst others) including non-stoichiometric silicon nitride-based compounds. In some embodiments, a SiN layer may be preferred. It is also possible for the layer to be formed of other types of materials according to other embodiments of the invention. Though all of the advantages associated with silicon nitride-based materials may not be achieved in these embodiments.

In some embodiments, it is preferable for layer 16 to have an amorphous (i.e., non-crystalline) crystal structure. In some embodiments, the layer may have a single crystal or poly-crystalline structure.

In some embodiments, it is preferred for layer 16 to be very thin, particularly when formed of amorphous and/or silicon nitride-based materials. It has been discovered that very thin layers formed directly on the substrate may absorb strain associated with lattice and thermal expansion differences between the substrate and overlying layers/regions (e.g., III-nitride material region). This absorption of strain may reduce generation of misfit dislocations (and other types of defects) and limit/prevent crack generation in the overlying layers/regions Suitable strain-absorbing layers which can also function as a dopant diffusion barrier have been described in commonly-owned, co-pending U.S. patent application Ser. No. 10/879,703, filed Jun. 28, 2004, entitled "Gallium Nitride Materials and Methods Associated with the Same" which is incorporated herein by reference and U.S. patent application Ser. No. 10/886,506, filed Jul. 7, 2004, entitled "III-Nitride Materials Including Low Dislocation Densities and Methods Associated with the Same" which is incorporated herein by reference.

In some embodiments, layer 16 has a thickness of less than about 100 Angstroms; and, in some cases, about 50 Angstroms. Layer 16 may have a thickness of greater than about 10 Angstroms which, in these embodiments, is sufficient to accommodate strain (e.g., resulting from lattice and thermal expansion differences) and can facilitate forming a layer that covers the entire substrate, as described further below. In other embodiments, the layer may have a thickness of greater than about 20 Angstroms to sufficiently accommodate strain. Suitable thickness ranges for the layer include all of those defined by the ranges described above (e.g., greater than about 10 Angstroms and less than about 100 Angstroms, greater than about 10 Angstroms and less than about 50 Angstroms, and the like).

In some cases, the thickness of layer 16 is relatively uniform across the entire layer. For example, in these cases, the layer may have a thickness uniformity variation of less than 25 percent, or less than 10 percent, across the entire strain-absorbing layer.

As described further below, in some embodiments, the layer when having a silicon nitride-based composition may be formed by nitridating a top surface region of a silicon substrate. That is, the surface region of the substrate may be converted from silicon to a silicon nitride-based material to form the layer. It should be understood that, as used herein, such layers may be referred to as being "formed on the substrate", "formed over the substrate", "formed directly on the substrate" and as "covering the substrate". Such phrases also refer to layers that are formed by depositing a separate layer (e.g., using a separate nitrogen source and silicon source) on the top surface of the substrate and are not formed by converting a surface region of the substrate.

In the illustrative embodiment, layer 16 covers substantially the entire top surface of the substrate. This arrangement may be preferable to minimize dopant diffusion and the generation of dislocations in overlying regions. In other embodiments, the layer may cover a majority of the top surface of the substrate (e.g., greater than 50 percent or greater than 75 percent of the top surface area).

As shown, III-nitride material region 12 is formed on layer 16. It should be understood that the term "region" may refer to one layer or may refer to a multiple layers. Thus, the III-nitride material region may comprise a number of III-nitride material layers or a single III-nitride material layer. In some cases, the III-nitride material region may also comprise a non-III-nitride material layer or feature.

As used herein, the term "III-nitride material" refers to any Group III element-nitride compound including boron nitride (BN), aluminum nitride (AlN), gallium nitride (GaN), indium nitride (InN) and thalium nitride (TIN), as well as any alloys including Group III elements and Group V elements (e.g., $Al_xGa_{(1-x)}N$, $Al_xIn_yGa_{(1-x-y)}N$, $In_yGa_{(1-y)}N$ $Al_yIn_{(1-y)}N$, $GaAs_aP_bN_{(1-a-b)}$, $Al_xIn_yGa_{(1-x-y)}As_aP_bN_{(1-a-b)}$ and the like). Typically, when present, arsenic and/or phosphorous are at low concentrations (i.e., less than 5 weight percent). III-Nitride materials may be doped n-type or p-type, or may be intrinsic.

In some preferred embodiments, the III-nitride material region comprises a gallium nitride material, as described further below. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$, gallium arsenide phosporide nitride ($GaAs_aP_bN_{(1-a-b)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in commonly-owned U.S. Pat. No. 6,649,287 which is incorporated herein by reference.

In the illustrative embodiment, the III-nitride material region includes an intermediate layer 18. Although, it should be understood that the intermediate layer is optional. Suitable III-nitride material intermediate layers include, but are not limited to, aluminum nitride-based materials (e.g., aluminum nitride, aluminum nitride alloys) and gallium nitride materials. The intermediate layer typically has a constant composition. Suitable intermediate layers are described further below and have been described in U.S. Pat. No. 6,649,287 incorporated by reference above.

It may be preferable for the intermediate layer to have a single crystal structure. It may be advantageous for the intermediate layer to have a single crystal structure because it facilitates formation of a single crystal layers (e.g., gallium nitride material layers) above the intermediate layer. In some embodiments, the intermediate layer has a different crystal structure than the substrate.

It should also be understood that the intermediate layer may not have a single crystal structure and may be amorphous or polycrystalline, though all of the advantages associated with the single crystal intermediate layers may not be achieved.

The intermediate layer may have any suitable thickness. For example, the intermediate layer may be between about 10 nanometers and 5 microns, though other thicknesses are also possible.

In the illustrative embodiment, a transition layer 20 is formed directly on the intermediate layer. In some preferred embodiments, the transition layer also comprises a III-nitride material region. In certain embodiments, it may be preferred for the transition layer to be formed of a compositionally-graded III-nitride material. Suitable compositionally-graded layers have been described in commonly-owned U.S. Pat. No. 6,649,287 which is incorporated by reference above.

Compositionally-graded transition layers have a composition that is varied across at least a portion of the layer. Compositionally-graded transition layers are particularly effective in reducing crack formation in gallium nitride material regions formed on the transition layer by lowering thermal stresses that result from differences in thermal expansion rates between the gallium nitride material and the substrate (e.g., silicon). Compositionally-graded transition layers may also contribute to reducing generation of screw dislocations in the III-nitride material layer(s)/region(s) (e.g., gallium nitride material layer(s)). In some cases, the compositionally-graded transition layers may also contribute to reducing mixed and edge dislocation densities.

According to one set of embodiments, the transition layer is compositionally-graded and formed of an alloy of gallium nitride such as $Al_xIn_yGa_{(1-x-y)}N$, $Al_xGa_{(1-x)}N$, and $In_yGa_{(1-y)}N$. In these embodiments, the concentration of at least one of the elements (e.g., Ga, Al, In) of the alloy is varied across at least a portion of the thickness of the transition layer. When the transition layer has an $Al_xIn_yGa_{(1-y)}N$ composition, x and/or y may be varied. When the transition layer has a $Al_xGa_{(1-x)}N$ composition, x may be varied. When the transition layer has a $In_yGa_{(1-y)}N$ composition, y may be varied.

In certain preferred embodiments, it is desirable for the transition layer to have a low gallium concentration at a back surface which is graded to a high gallium concentration at a front surface. It has been found that such transition layers are particularly effective in relieving internal stresses within overlying gallium nitride material layers. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer).

In some preferred embodiments, structure 10 includes an aluminum nitride intermediate layer and a compositionally-graded transition layer. In some preferred embodiments, the compositionally-graded transition layer has a composition of $Al_xGa_{(1-x)}N$, where x is graded from a value of 1 at the back surface of the transition layer to a value of 0 at the front surface of the transition layer. The composition, for example, can be graded discontinuously (e.g., step-wise) or continuously. One discontinuous grade may include steps of AlN, $Al_{0.6}Ga_{0.4}N$ and $Al_{0.3}Ga_{0.7}N$ proceeding in a direction toward the gallium nitride material layer.

It should be understood that, in other cases, transition layer 20 may have a constant composition and may not be compositionally-graded. In some cases (e.g., when the substrate is not a silicon substrate), the transition layer may have a constant composition. Suitable compositions include, but are not limited to, aluminum nitride-based materials (e.g., aluminum nitride, aluminum nitride alloys) and gallium nitride materials. In these constant composition embodiments, the transition layer may be similar to the intermediate layer described above.

In some preferred embodiments, the III-nitride material region includes a gallium nitride material layer. As described further below, oftentimes, the structure includes more than one gallium nitride material layer which form, in part, the active region of the device.

Preferably, gallium nitride material layer 22 has a low crack level. As described above, the transition layer (particularly when compositionally-graded) and/or intermediate layer may reduce crack formation. Gallium nitride materials having low crack levels have been described in U.S. Pat. No. 6,649,287 incorporated by reference above. In some cases, the gallium nitride material region has a crack level of less than 0.005 $\mu m/\mu m^2$. In some cases, the gallium nitride material region has a very low crack level of less than 0.001 $\mu m/\mu m^2$. In certain cases, it may be preferable for the gallium nitride material region to be substantially crack-free as defined by a crack level of less than 0.0001 $\mu m/\mu m^2$.

In certain cases, gallium nitride material layer has a single crystal (i.e., monocrystalline) structure. In some cases, the gallium nitride material region includes one or more layers having a Wurtzite (hexagonal) structure.

The thickness of the gallium nitride material layer and the number of different layers are dictated, at least in part, on the application in which the structure is used. At a minimum, the total thickness of the gallium nitride material layer(s) is sufficient to permit formation of the desired structure or device. The total thickness of the gallium nitride material layer(s) is generally greater than 0.1 micron, though not always. In other cases, the total thickness is greater than 2.0 microns, or even greater than 5.0 microns.

Layer 16, intermediate layer 18 and transition layer 20 are not typically (though may be) part of the active region of devices formed from structures of the invention. As described above, these layers may be formed to facilitate deposition of gallium nitride material layer 22. However, in some cases, the intermediate layer and/or transition layer may have other functions including functioning as a heat spreading layer that helps remove heat from active regions of the semiconductor structure during operation of a device. For example, such transition layers that function as heat spreading layers have been described in U.S. Patent Application Publication No. 2002-0117695, published Aug. 29, 2002, entitled "Gallium Nitride Materials Including Thermally-Conductive Regions," which is incorporated herein by reference.

Figure 2:
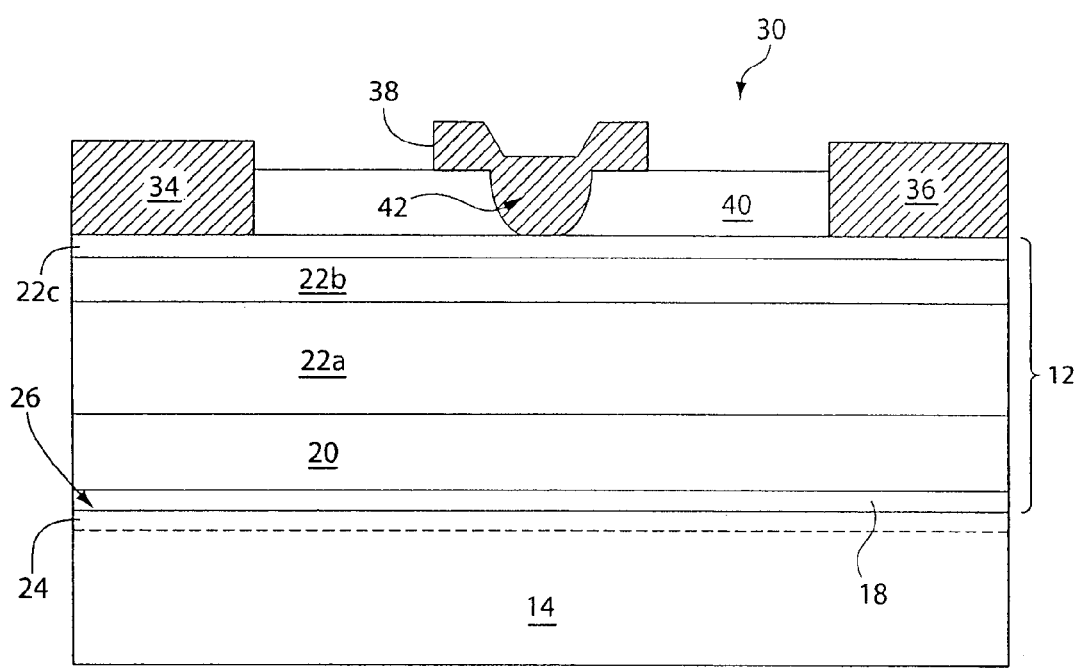
FIG. 2 illustrates a transistor including a III-nitride material region formed on a silicon substrate according to one embodiment of the invention.

Active regions of devices formed from the structure of the invention may be formed, in part, in one or more gallium nitride material layer 22. For example, structures may include multiple gallium nitride material layers (e.g., 22a, 22b, 22c) as shown in FIG. 2 and described further below. Suitable gallium nitride material layer arrangements have been described, for example, in commonly-owned, co-pending U.S. patent application Ser. No. 10/740,376 entitled "Gallium Nitride Material Devices Including an Electrode- Defining Layer and Methods of Forming the Same," filed Dec. 17, 2003, which is incorporated herein by reference.

The semiconductor structures illustrated in FIG. 1 may form the basis of a variety of semiconductor devices. Suitable devices include, but are not limited to, transistors (e.g., FETs), as well as light-emitting devices including LEDs and laser diodes. It may be particularly advantageous to use structures of the invention in devices that operate at high frequencies. The devices have active regions that are typically, at least in part, formed within the III-nitride material region (e.g., in one or more gallium nitride material layer). Also, the devices include a variety of other functional layers and/or features (e.g., electrodes).

For example, FIG. 2 illustrates a FET device 30 according to one embodiment of the invention. Device 30 includes a source electrode 34, a drain electrode 36 and a gate electrode 38 formed on a series of gallium nitride material layers (22a, 22b, 22c). The device also includes an electrode defining layer 40 which, as shown, is a passivating layer that protects and passivates the surface of the gallium nitride material region. A via 42 is formed within the electrode defining layer in which the gate electrode is, in part, formed. Layer 16 is formed directly on substrate 14 and intermediate layer 18 is formed directly on layer 16.

In certain embodiments, it may be preferable for the gallium nitride material of layer 22b to have an aluminum concentration that is greater than the aluminum concentration of the gallium nitride material of layer 22a. For example, the value of x in the gallium nitride material of layer 22b (with reference to any of the gallium nitride materials described above) may have a value that is between 0.05 and 1.0 greater than the value of x in the gallium nitride material of layer 22a; or, between 0.05 and 0.5 greater than the value of x in the gallium nitride material of layer 22a. For example, layer 22b may be formed of $Al_{0.26}Ga_{0.74}N$, while layer 22a is formed of GaN. This difference in aluminum concentration may lead to formation of a highly conductive region at the interface of the layers 22b, 22a (i.e., a 2-D electron gas region). In the illustrative embodiment, layer 22c may be formed of GaN.

It should be understood that other structures and devices may be within the scope of the present invention including structures and devices that are not specifically described herein. Other structures may include other layers and/or features, amongst other differences.

Methods of the invention include techniques for limiting the diffusion of dopants into the silicon substrate which, thus, reduces the carrier concentration in the parasitic channel. Dopants generally diffuse into the substrate after accumulating on the substrate surface, or on the surface of a layer overlying the substrate through which the dopants also diffuse. Thus, as described further below, the methods may include limiting the accumulation of dopants on the substrate (or overlying layer) surface.

As noted above, the source of the dopants that diffuse into the substrate may be reactive species (e.g., gallium and/or aluminum) that participate in the reaction that forms the III-nitride material region. These reactive species may accumulate on the substrate (or overlying layer) surface, for example, after being introduced into a reaction chamber in which the substrate is placed, but prior to formation of the III-nitride material region on the substrate. In some cases, the accumulated dopants may be residual reaction-by-products in the reaction chamber, for example, from prior growth processes. Also, in some cases, dopants may be accumulated on the substrate surface prior to the substrate being introduced into the reaction chamber.

Methods of the invention may include using conventional semiconductor processing techniques. Such processing techniques generally involve growing layers on the substrate in a process chamber under vacuum conditions.

Some methods may include cleaning the substrate surface prior to growing overlying layers and, typically, before introduction into the process chamber. The substrate surface may be cleaned to remove residual dopant species that may diffuse into the substrate during processing. For example, the substrate may be cleaned by wet chemical cleaning agents such as buffered oxide etch (BOE), hydro-fluoric acid (HF), RCA clean (which is a commercial, proprietary silicon surface cleaning agent) etc. Substrates may also be cleaned by a combination of such agents. The surface of the silicon substrate may be cleaned with organic solvents such as acetone, methanol, trichloroethylene, isopropyl alcohol etc to rid the surface of organic contamination.

In some embodiments, methods of the invention may include controlling the residual (e.g., residual reaction by-products) amounts of dopant in the process chamber. For example, the amount of residual dopant may be reduced by purging the chamber with a gas (e.g., $NH_3$) while heating to an elevated temperature, prior to introducing the substrate into the chamber. Purging has been found to minimize accumulation of reaction-by-products on reaction chamber walls and components.

The methods of the invention may also include counter-doping the surface region of the substrate to compensate for the above-described diffusion of the dopant species into the substrate. The counter-doping is performed to reduce the net carrier concentration of the parasitic conducting region. For example, if the dopant species that diffuses into the substrate is p-type (e.g., Al, Ga); then, the counter-doping step involves introducing an n-type dopant into the surface region.

The counter-doping step may be performed in a number of ways including growing a counter-doped epitaxial layer (e.g., ex-situ); and, implanting (or diffusing) a counter-dopant into the substrate surface; and, implanting a species using high energies such that the surface region becomes non-conductive.

In embodiments in which a silicon nitride-based material (e.g., amorphous SiN), layer is formed directly on the substrate surface to function as a diffusion barrier (amongst other features), the layer may be formed by nitridating a top surface of the silicon substrate. In a nitridation process, nitrogen reacts with a top surface region of the silicon substrate to form a silicon nitride-based layer. The top surface may be nitridated by exposing the silicon substrate to a gaseous source of nitrogen at elevated temperatures. For example, ammonia may be introduced into a process chamber in which a silicon substrate is positioned. The temperature in the process chamber may be between about 1000° C. and about 1100° C. and the pressure may be between about 20 torr and about 40 torr (in some cases, about 30 torr). The reaction between nitrogen and the silicon substrate is allowed to proceed for a reaction time selected to produce a layer having a desired thickness.

It should be understood that other processes may be used to form silicon nitride-based layers including processes (e.g., CVD processes) that use separate nitrogen and silicon sources. Also, when layer 16 is formed of another type of material (non-silicon nitride-based material), other deposition processes known in the art are used.

In some embodiments, layer 16 may be formed in-situ with overlying layers (e.g., III-nitride material region) of the structure. That is, the layer may be formed during the same deposition step as the intermediate layer (and, in some cases, subsequent layers).

The III-nitride material region may be formed using known growth techniques.

According to one preferred method, the intermediate layer, transition layer and gallium nitride material layer are grown using a metalorganic chemical vapor deposition (MOCVD) process. It should be understood that other suitable techniques known in the art may also be utilized to deposit these layers including molecular beam epitaxy (MBE), hydride vapor phase epitaxy (HVPE), and the like.

Generally, the MOCVD process involves introducing different reactive source gases (e.g., Al source gases, Ga source gases, N source gases) into the process chamber and providing conditions which promote a reaction between the gases to form a layer. The reaction proceeds until a layer of desired thickness is achieved. The composition of the layer may be controlled, as described further below, by several factors including gas composition, gas concentration, and the reaction conditions (e.g., temperature and pressure).

In some embodiments, the methods of the invention include optimizing nucleation/growth conditions for the III-nitride material region. The conditions are selected to rapidly (i.e., shortly after introduction of the group III reactive species and nitrogen reactive species) initiate the growth of the III-nitride material region (e.g., intermediate layer 18) on layer 16 (or substrate, when layer 16 is absent). By reducing the time after introduction of the group III element and nitrogen reactive species and the growth of the III-nitride material region, the accumulation of reactive species on the substrate (or overlying layer) surface is reduced. The conditions are also selected to reduce the resident time of the reactant species (e.g., Al species, Ga species).

Those of ordinary skill in the art understand how to select growth conditions that would result in rapid nucleation of the III-nitride material and how to reduce resident time of the reactant species. The conditions may be selected to achieve the desired result by controlling, for example, the nucleation temperature, substrate heat-up conditions, velocity and/or concentration of the of the reactive species. For example, it generally is desirable to increase substrate heat up times and increase reactive species gas velocity to achieve these results. Although, the specific growth conditions depend on the particular process and reactor.

In processes that grow a silicon nitride-based material layer by introducing a nitrogen source (e.g., ammonia) into a reaction chamber as described above, a second source gas may be introduced into the chamber after a selected time delay after the nitrogen source. The second source reacts with the nitrogen source to form an overlying layer (e.g., intermediate layer 18 of the III-nitride material region), thus, ending growth of layer 16. For example, when the intermediate layer is formed of aluminum nitride, an aluminum source (e.g., trimethylaluminum) is introduced into the chamber at a selected time after the nitrogen source (e.g., ammonia). The time delay is selected so that the layer grows to a desired thickness and to minimize accumulation of dopants on the surface. The reaction between the second source (e.g., aluminum source) and the nitrogen source is allowed to proceed for a sufficient time to produce the intermediate layer. When the intermediate layer has a single crystal structure, the reaction conditions are selected appropriately. For example, the reaction temperature may be greater than 700° C., such as between about 1000° C. and about 1100° C. In some cases, lower growth temperatures may be used including temperatures between about 500° C. and about 600° C.

Examples of suitable source gases for MOCVD growth of the intermediate layer, transition layer and gallium nitride material layer(s) include trimethylaluminum (TMA) or triethylaluminum (TEA) as sources of aluminum; trimethylindium (TMI) or triethylindium (TEI) as sources of indium; trimethylgallium (TMG) or trimethylgallium (TEG) as sources of gallium; and ammonia ($NH_3$) as a source of nitrogen. The particular source gas used depends upon the desired composition of the layers. For example, an aluminum source (e.g., TMA or TEA), a gallium source (TMG or TEG), and a nitrogen source are used to deposit films having an $Al_xGa_{1-x}N$ composition.

The flow rates of the source gases, the ratios of the source gases, and the absolute concentrations of the source gases may be controlled to provide transition layers and gallium nitride material regions having the desired composition. For the growth of $Al_xGa_{1-x}N$ layers, typical TMA flow rates are between about 5 μmol/min and about 50 μmol/min with a flow rate of about 20 μmol/min being preferred in some cases; typical TMG flow rates are between about 5 μmol/min and 250 μmol/min, with a flow rate of 115 μmol/min being preferred in some cases; and the flow rate of ammonia is typically between about 3 slpm to about 10 slpm. Methods of the invention may include using relatively high flow rates (and also higher gas velocities) which have been found to be particularly effective in minimizing accumulation of dopants.

The reaction temperatures are generally between about 900° C. and about 1200° C. and the process pressures are between about 1 Torr and about 760 Torr. It is to be understood that the process conditions, and in particular the flow rate, are highly dependent on the process system configuration. Typically, smaller throughput systems require less flow than larger throughput systems.

When forming a compositionally-graded transition layer, process parameters may be suitably adjusted to control the compositional grading. The composition may be graded by changing the process conditions to favor the growth of particular compositions. For example, to increase incorporation of gallium in the transition layer thereby increasing the gallium concentration, the flow rate and/or the concentration of the gallium source (e.g., TMG or TEG) may be increased. Similarly, to increase incorporation of aluminum into the transition layer thereby increasing the aluminum concentration, the flow rate and/or the concentration of the aluminum source (e.g., TMA or TEA) may be increased. The manner in which the flow rate and/or the concentration of the source is increased (or decreased) controls the manner in which the composition is graded. In other embodiments, the temperature and/or pressure is adjusted to favor the growth of a particular compound. Growth temperatures and pressures favoring the incorporation of gallium into the transition layer differ from the growth temperatures and pressures favoring the incorporation of aluminum into the transition layer. Thus, the composition may be graded by suitably adjusting temperature and pressure.

When depositing a transition layer or a gallium nitride material layer (or an intermediate layer) having a constant composition, however, the process parameters are maintained constant so as to provide a layer having a constant composition. When gallium nitride material regions include more than one gallium nitride material layer having different respective compositions, the process parameters may be changed at the appropriate time to change the composition of the layer being formed.

It should be understood that all of the layers/regions on the substrate may be grown in the same process (i.e., the strain-absorbing layer, intermediate layer, transition layer and the gallium nitride material region). Or, respective layers/regions may be grown separately.

The processes described involve growing the layers/regions (i.e., the strain-absorbing layer, intermediate layer, transition layer and the gallium nitride material region) in vertical growth processes. That is, these layers/regions are grown in a vertical direction with respect to underlying layers/regions (including substrate).

However, in other embodiments of the invention (not shown), it is possible to grow, at least a portion of, the gallium nitride material layer using a lateral epitaxial overgrowth (LEO) technique, for example, as described in U.S. Pat. No. 6,051,849; or a pendeoepitaxial technique that involves growing sidewalls of gallium nitride material posts into trenches until growth from adjacent sidewalls coalesces to form a gallium nitride material region, for example, as described in U.S. Pat. No. 6,265,289.

Commonly-owned, co-pending U.S. patent application Ser. No. 10/740,376 entitled "Gallium Nitride Material Devices Including an Electrode-Defining Layer and Methods of Forming the Same," filed Dec. 17, 2003, which is incorporated herein by reference above, further describes techniques used to grow other layers and features shown in the embodiment of FIG. 2.

It should also be understood that other processes may be used to form structures and devices of the present invention as known to those of ordinary skill in the art.

As described above, methods of the invention include reducing the free carrier concentration in parasitic channels formed at the surface of silicon substrates. The parasitic losses in the resulting structures may be significantly reduced which leads to performance improvements. For example, devices (such as RF devices) formed of structures of the invention may have higher output power, power gain and efficiency, amongst other advantages.

One technique for characterizing the parasitic loss in a structure (e.g., similar to the material structure shown in FIG. 1) is to measure the transmission line loss. Transmission line loss measurement techniques are known to those of ordinary skill in the art. The techniques involve measuring the power level of an input signal (e.g., RF or microwave) to a transmission line on a test structure and measuring the power level of an output signal from the test structure. The transmission line loss is the input signal power level divided by the output signal power level. The transmission line loss is typically represented in dB/mm length of transmission line. The transmission line has known dimensions, a known impedance and may be formed of conductors that are sufficiently conductive to ensure that ohmic loss does not significantly effect transmission loss. The transmission line loss may be measured as a function of signal frequency.

Figure 3:
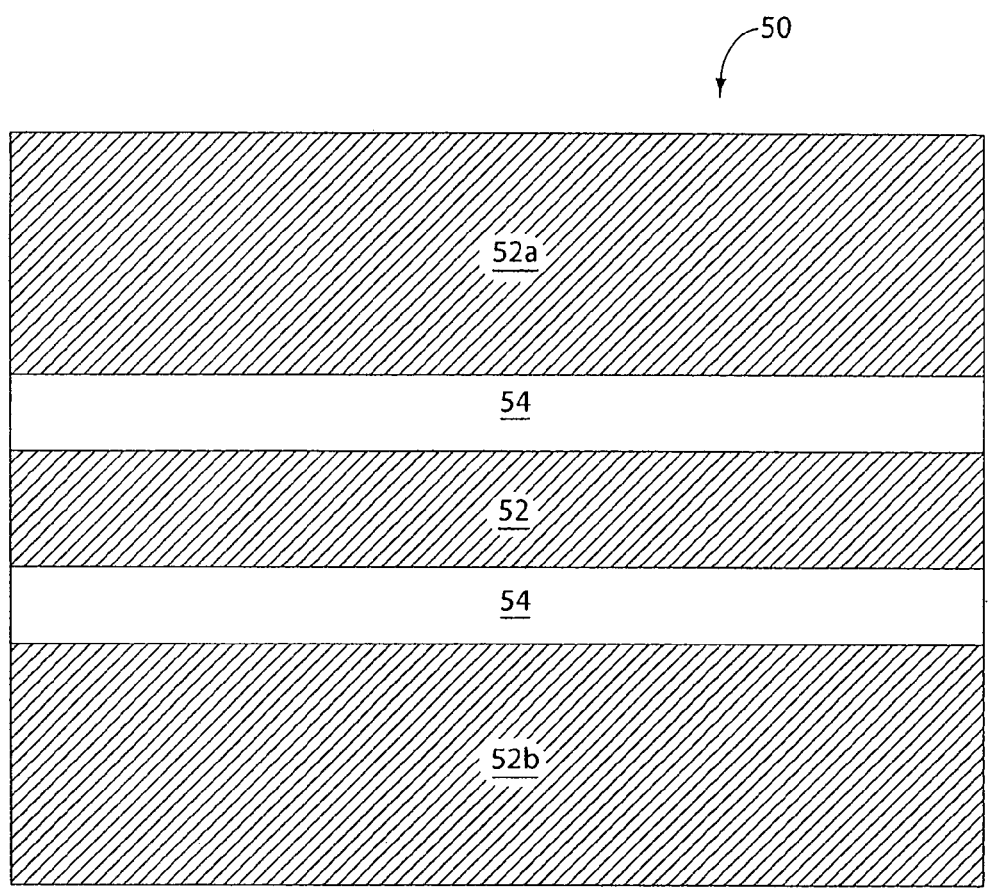
FIG. 3 shows a transmission line measurement structure.

An example of a measurement structure 50 suitable for measuring transmission line loss of a material structure (e.g., similar to the material structure shown in FIG. 1) is shown in FIG. 3. The illustrated measurement structure has an impedance of 50 Ohms and includes a center conductor line 52 having a width of 110 microns. The center conductor is separated from metallic strips 52a and 52b by 71 microns. Regions 54 are exposed surface regions of the structure. It should be understood that this is an example of a test structure and that other suitable structures are possible.

Because of the reduction in the free carrier concentration in the parasitic channel, structure of the invention have very low transmission line losses. The low transmission line losses are achievable at high frequencies and over broad frequency ranges. For example, structures of the invention have a transmission line loss of less than 1.0 dB/mm over a frequency range between 0 and 5 GHz, or between 0 and 15 GHz. In some embodiments, structures of the invention have a transmission line loss of less than 1.0 dB/mm over a frequency range between 0 and 26 GHz; and, in some cases, a transmission line loss of less than 1.0 dB/mm over a frequency range between over 0 and 40 GHz. In some cases, the transmission line loss may be less than 0.5 dB/mm over the above-noted frequency ranges.

The low transmission line loss, which is indicative of low parasitic losses, makes structures of the invention particularly attractive in high frequency (e.g., RF) applications.

The following Examples are not intended to be limiting.

EXAMPLE 1

This example compares a structure produced according to a method of the invention that includes a parasitic channel having a reduced free carrier concentration to a structure produced according to a conventional method in which the free carrier concentration of the parasitic channel is not reduced.

Both methods started with a 100 mm silicon substrate (111) having a resistivity of greater than about $10^4$ ohm-cm. Both methods involved growing an AlN layer on the substrates in a MOCVD reactor at a nominal growth temperature of about 1030° C.

In the conventional method, the aluminum source gas was introduced into the reactor chamber followed by introduction of the nitrogen source gas.

In the method of the invention, the nitrogen source gas was introduced into the reactor chamber prior to the introduction of the aluminum source. This is believed to form a silicon nitride layer directly on the surface of the substrate which, as noted in the description above, can function as a diffusion barrier for dopants that can create free carriers in the substrate. The aluminum source gas and nitrogen source gas flow velocities were also increased by a factor of about two. This has the additional benefit of reducing the residence time of the reactant and reaction by-product species in the MOCVD reactor. The substrate heat-up time was also decreased relative to the conventional method (e.g., 7 minutes to 5 minutes).

Figure 4A:
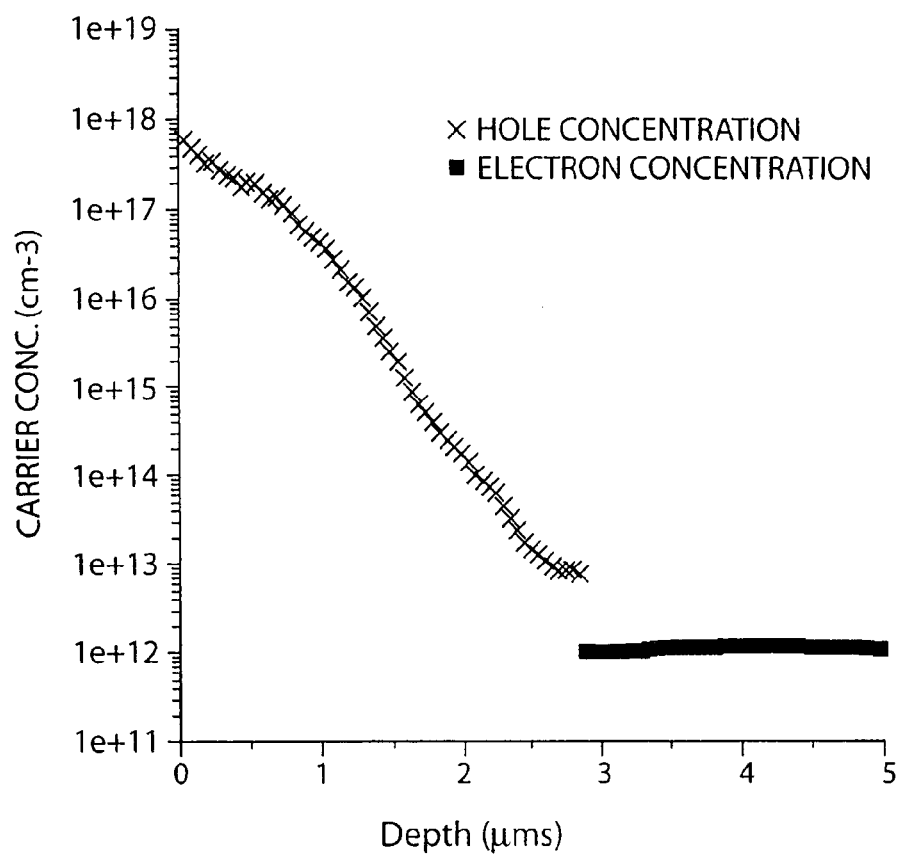
FIGS. 4A and 4B are respective carrier concentration profiles obtained using SRP and SIMS for the comparative structures described in Example 1.
Figure 4B:
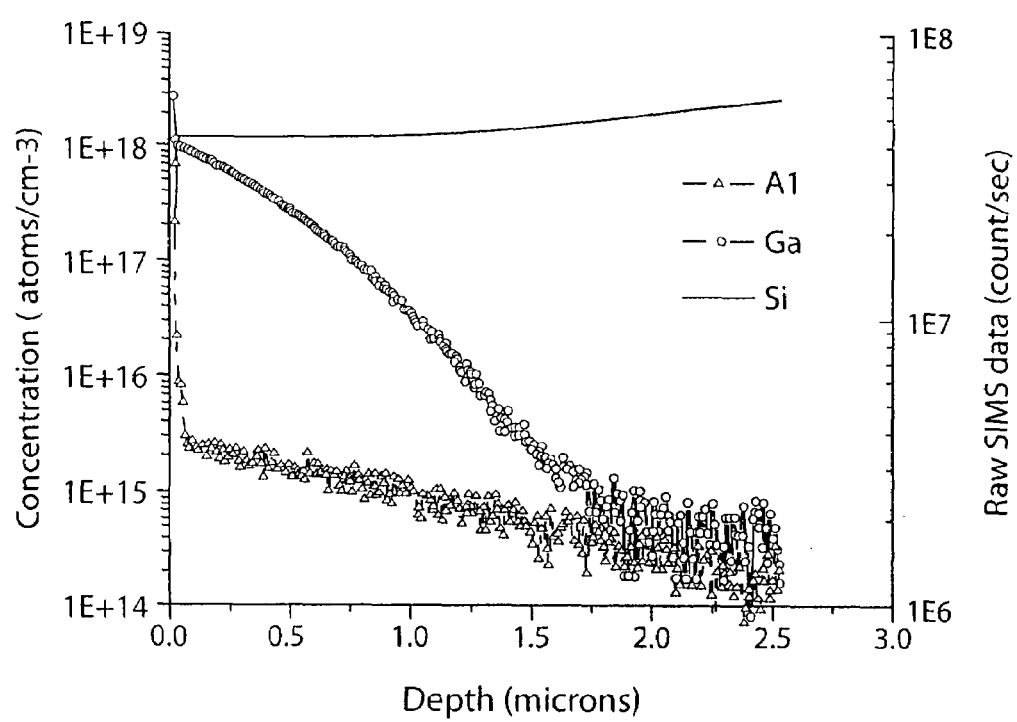
Figure 5A:
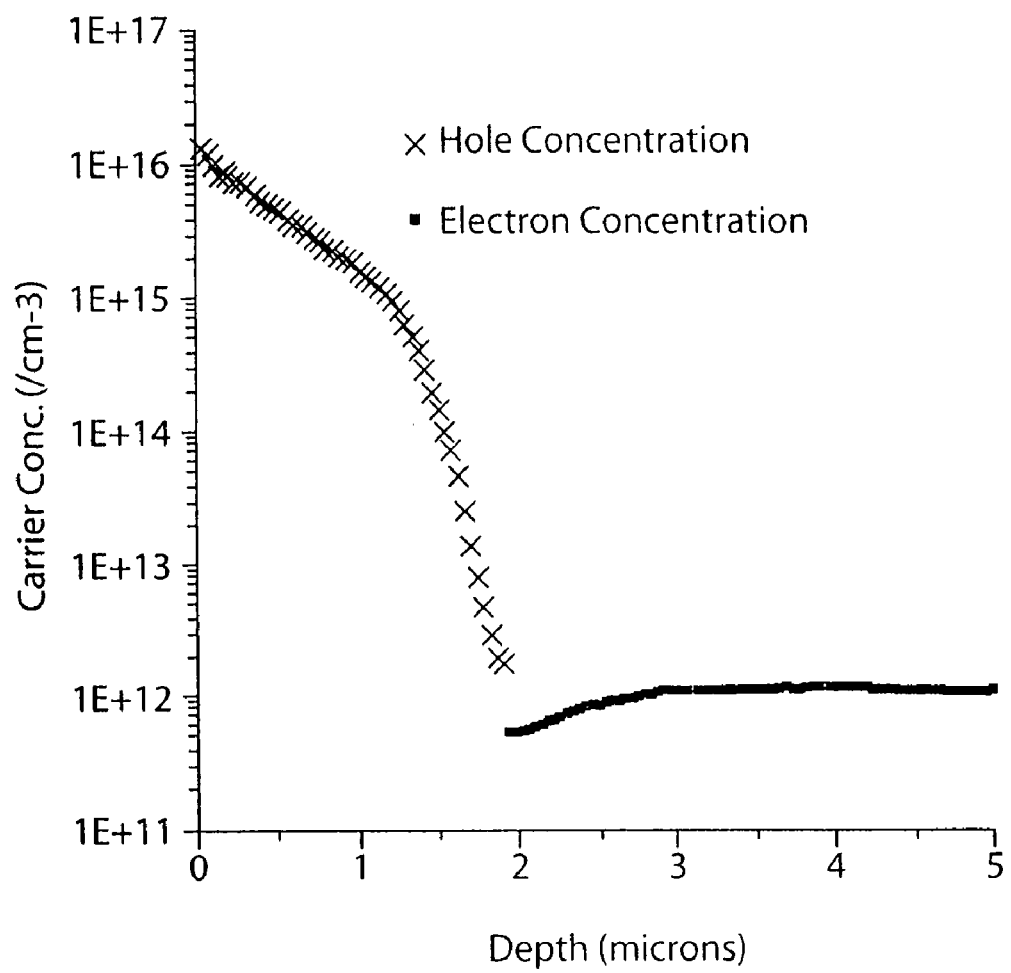
FIGS. 5A and 5B are respective carrier concentration profiles obtained using SRP and SIMS for structures of the invention described in Example 1.
Figure 5B:
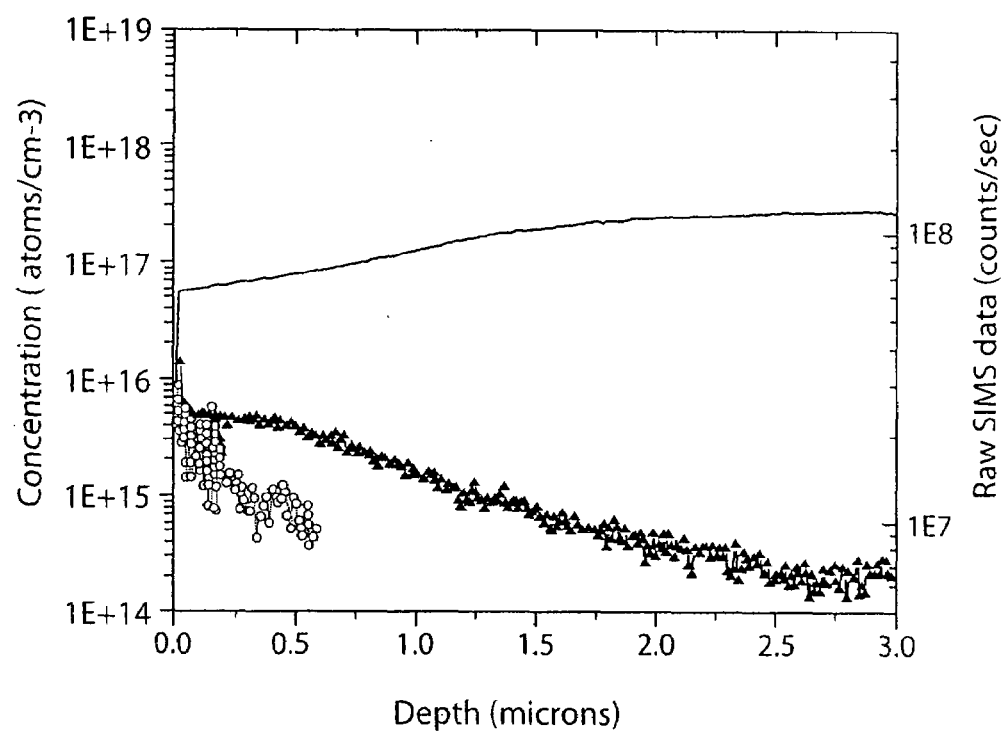

The free carrier concentration as a function of depth into the silicon substrate was measured for both structures using SRP and SIMS. FIGS. 4A and 4B are the respective carrier concentration profiles obtained using SRP and SIMS for the comparative structures. FIGS. 5A and 5B are the respective carrier concentration profiles obtained using SRP and SIMS for the structures of the invention.

The profiles indicate that parasitic conductive channels are formed in both structures which include a free carrier concentration elevated with respect to the carrier concentration of the bulk silicon (e.g., $10^{12}/cm^3$). The structures of the invention have a peak free carrier concentration in the parasitic channel of about $10^{16}/cm^3$ which is significantly lower (about 2 orders of magnitude) than the peak free carrier concentration of about $10^{18}/cm^3$ in the conventional structure. This significant difference is maintained with increasing depth into the substrate. These differences would translate into significantly lower parasitic losses in structures of the invention as compared to conventional structures.

This example establishes that methods of the invention are effective in reducing the peak free carrier concentration in the parasitic conducting channel which, in turn, lowers parasitic losses associated with the resulting structures.

EXAMPLE 2

This example compares structures produced according to a method of the invention to a structure produced according to a conventional method.

Both methods started with a 100 mm silicon substrate (111) having a resistivity of greater than about $10^4$ ohm-cm. Both methods involved growth processes in an MOCVD reactor at a nominal growth temperature of about 1030° C. In both cases, an AlN intermediate layer was grown on the silicon substrate; a compositionally-graded AlGaN transition layer was grown on the intermediate layer; a GaN layer was grown on the transition layer; and, an AlGaN layer was grown on the GaN layer.

In the conventional method, the aluminum source gas was introduced into the reactor chamber followed by introduction of the nitrogen source gas at the start of the growth process.

In the methods of the invention, the nitrogen source gas was introduced into the reactor chamber prior to the introduction of the aluminum source. This is believed to form a silicon nitride layer directly on the surface of the substrate which, as noted in the description above, can function as a diffusion barrier for dopants that can create free carriers in the substrate. The aluminum source gas and nitrogen source gas flow velocities were also increased by a factor of about two. This has the additional benefit of reducing the residence time of the reactant and reaction by-product species in the MOCVD reactor. The substrate heat-up time was also decreased relative to the conventional method (e.g., 7 minutes to 5 minutes).

Both structures were further processed to form transmission line structures similar to that illustrated in FIG. 3 and described above. Transmission line measurements were conducted over a frequency range of 0 to 15 GHz for both structures. Transmission line measurements were also conducted over a frequency range of 0 to 26 GHz for additional structures produced according to the methods of the invention.

Figure 6:
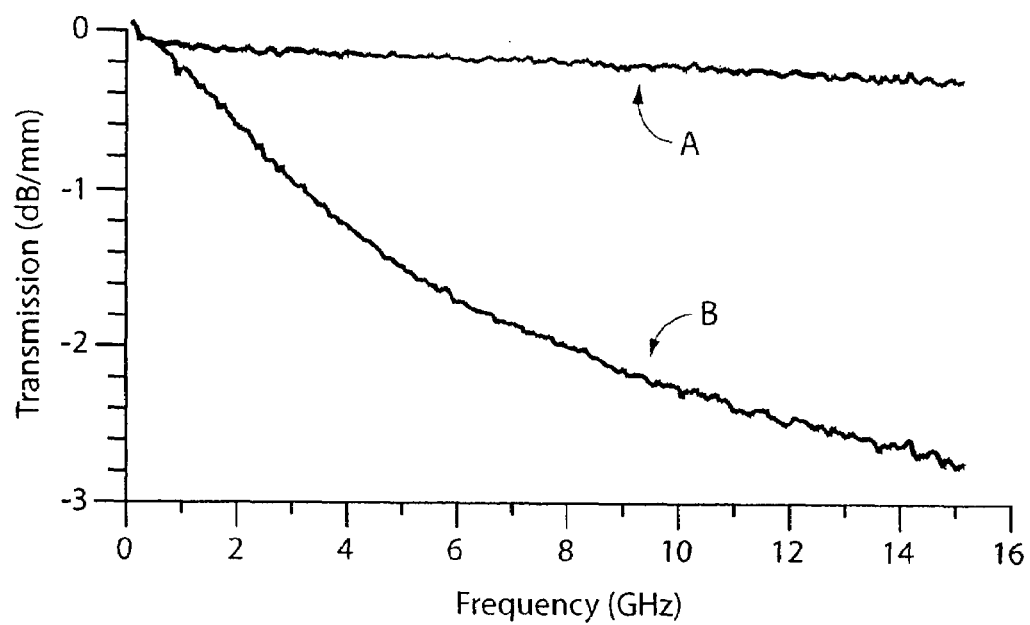
FIG. 6 is a graph of transmission versus frequency for a structure of the invention (line A) and a comparative structure (line B) as described in Example 2.

FIG. 6 illustrates transmission as a function of frequency (0-15 GHz) for structures produced according to the methods of the invention (A) and structures produced according to the conventional method (B). As shown, the transmission (normalized in dB/mm transmission line length) is significantly higher (less negative) for structures of the invention as compared to the conventional structures. The transmission for the structures of the invention is relatively constant and approaches 0 (greater than −0.5 dB/mm) over the entire frequency range; while, the transmission for the conventional structures decreases significantly with increasing frequency. It should be understood that transmission line loss is the negative of transmission. Thus, the structures of the invention have a very low transmission line loss (e.g., less than 0.5 dB/mm) over the entire frequency range.

Figure 7:
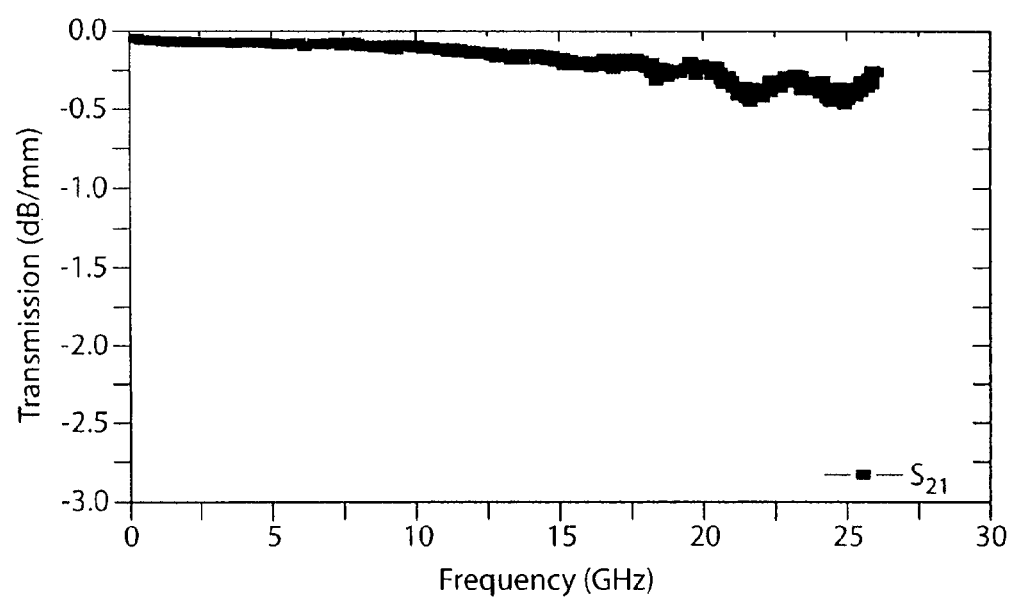
FIG. 7 is a graph of transmission line versus frequency for a structure of the invention as described in Example 2.

FIG. 7 illustrates transmission as a function of frequency (from 0-26 GHz) for structures produced according to the methods of the invention. The results are similar to those in FIG. 6, though illustrate that the low transmission line loss is achievable over even greater frequency ranges.

This example establishes that methods of the invention are effective in reducing transmission line loss which is a result of reduced parasitic losses. Thus, devices formed using these structures are particularly attractive in high frequency applications.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A semiconductor structure comprising:
   a silicon substrate having a resistivity of greater than $10^2$ Ohms-cm, the silicon substrate including a top surface region having a peak free carrier concentration of less than $10^{17}/cm^3$; and
   a III-nitride material region formed over the top surface of the silicon substrate.

2. The structure of claim 1, wherein the silicon substrate has a resistivity of greater than $10^4$ Ohms-cm.

3. The structure of claim 1, wherein the silicon substrate includes a bulk region below the top surface region, the bulk region having a lower peak carrier concentration than the top surface region.

4. The structure of claim 3, wherein the bulk region is doped with a first carrier type and the top surface region is doped with a second carrier type.

5. The structure of claim 3, wherein the peak carrier concentration in the bulk region is less than $10^{13}/cm^3$.

6. The structure of claim 1, wherein the top surface region extends to a depth of at least 1.0 micron.

7. The structure of claim 1, wherein the top surface region has a peak carrier concentration of less than $10^{16}/cm^3$.

8. The structure of claim 1, wherein the carrier concentration of the top surface region decreases in a direction away from the top surface.

9. The structure of claim 1, further comprising a silicon nitride-based material layer formed between the silicon substrate and the III-nitride material region.

10. The structure of claim 9, wherein the silicon nitride-based material layer has a thickness between about 10 Angstroms and about 50 Angstroms.

11. The structure of claim 1, wherein the III-nitride material region comprises a gallium nitride layer.

12. The structure of claim 1, wherein the III-nitride material region comprises an aluminum nitride layer.

13. The structure of claim 1, wherein the III-nitride material comprises a transition layer formed between the silicon substrate and the gallium nitride material region, wherein the concentration of gallium increases in a direction away from the silicon substrate.

14. The structure of claim 1, wherein the structure is a transistor.

15. The structure of claim 1, wherein the top surface region comprises dopants that create, in part, the free carriers.

16. The structure of claim 1, wherein the dopants comprise gallium and/or aluminum.

17. The structure of claim 1, wherein the dopants comprise species that react to form the III-nitride material region.

18. A semiconductor structure comprising:
    a silicon substrate; and
    a III-nitride material region formed on the silicon substrate, wherein the structure has a transmission line loss of less than 1.0 dB/mm over a frequency range between 0 and 5 GHz.

19. The structure of claim 18, wherein the structure has a transmission line loss of less than 1.0 dB/mm over a frequency range between 0 and 15 GHz.

20. The structure of claim 18, wherein the structure has a transmission line loss of less than 1.0 dB/mm aver a frequency range between 0 and 26 GHz.

21. The structure of claim 18, wherein the silicon substrate has a resistivity of greater than $10^2$ Ohms-cm.

22. The structure of claim 18, wherein the silicon substrate has a resistivity of greater than $10^4$ Ohms-cm.

23. The structure of claim 18, wherein the silicon substrate includes a top surface region having a peak free carrier concentration of less than $10^{17}/cm^3$.

24. The structure of claim 23, wherein the top surface region having a peak free carrier concentration of less than $10^{16}/cm^3$.

25. The structure of claim 18, wherein the carrier concentration of the top surface region decreases in a direction away from the top surface.

26. The structure of claim 18, wherein the silicon substrate includes a bulk region below the top surface region, the bulk region having a lower peak carrier concentration than the top surface region.

27. The structure of claim 18, further comprising a silicon nitride-based material layer formed between the silicon substrate and the III-nitride material region.

28. The structure of claim 18, wherein the III-nitride material region comprises a gallium nitride layer.

29. The structure of claim 18, wherein the III-nitride material region comprises an aluminum nitride layer.

30. The structure of claim 18, wherein the III-nitride material comprises a transition layer formed between the silicon substrate and the gallium nitride material region, wherein the concentration of gallium increases in a direction away from the silicon substrate.

31. The structure of claim 18, wherein the top surface region comprises dopants that create, in part, the free carriers.

32. The structure of claim 31, wherein the dopants comprise gallium and/or aluminum.

* * * * *